(12) United States Patent
Kim et al.

(10) Patent No.: US 7,525,386 B2
(45) Date of Patent: Apr. 28, 2009

(54) ACTIVE CIRCUIT HAVING IMPROVED LINEARITY USING MULTIPLE GATED TRANSISTOR

(75) Inventors: Tae Wook Kim, Yongin-si (KR); Bonkee Kim, Seongnam-si (KR); Kwyro Lee, Daejeon (KR)

(73) Assignee: Integrant Technologies Inc., Gyeonggi-Do (KR)

( * ) Notice: Subject to any disclaimer, the term of this patent is extended or adjusted under 35 U.S.C. 154(b) by 0 days.

(21) Appl. No.: 12/146,299

(22) Filed: Jun. 25, 2008

(65) Prior Publication Data
US 2008/0258819 A1  Oct. 23, 2008

Related U.S. Application Data

(62) Division of application No. 11/178,481, filed on Jul. 12, 2005, now Pat. No. 7,400,198.

(30) Foreign Application Priority Data
Sep. 7, 2004 (KR) .................. 10-2004-0071149

(51) Int. Cl.
*H03F 3/68* (2006.01)
(52) U.S. Cl. .................. 330/295; 330/124 R
(58) Field of Classification Search .............. 330/295, 330/311, 285, 253
See application file for complete search history.

(56) References Cited

U.S. PATENT DOCUMENTS

| | | | |
|---|---|---|---|
| 5,602,508 A * | 2/1997 | Endou et al. | 330/252 |
| 6,392,486 B1 * | 5/2002 | Lemay, Jr. | 330/253 |
| 6,727,729 B2 | 4/2004 | Brooks et al. | |
| 7,414,481 B2 * | 8/2008 | Li et al. | 330/311 |
| 2006/0152288 A1 | 7/2006 | Peng et al. | |
| 2006/0220746 A1 * | 10/2006 | Kulasekeram | 330/308 |
| 2007/0109026 A1 * | 5/2007 | Ho | 327/65 |

OTHER PUBLICATIONS

Office Action issued Oct. 24, 2007, in U.S. Appl. No. 11/178,481, 6 sheets.
Office Action issued Jun. 6, 2007, in U.S. Appl. No. 11/178,481, 6 sheets.
Office Action issued Mar. 26, 2007, in U.S. Appl. No. 11/178,481, 5 sheets.
Office Action issued Sep. 15, 2008, in U.S. Appl. No. 12/146,308, 12 pages.

* cited by examiner

*Primary Examiner*—Robert Pascal
*Assistant Examiner*—Hieu P Nguyen
(74) *Attorney, Agent, or Firm*—Foley & Lardner LLP (57) ABSTRACT

The present invention relates to improved linearity of an active circuit, and more particularly, to an active circuit having improved linearity using a main circuit unit and an assistant circuit unit. According to the present invention, the common gate circuit includes a main circuit unit consisting of a common gate circuit having a drain terminal through which an input signal is output as an output signal, an assistant circuit unit having a common gate circuit in order to assist the linearity of the main circuit unit, a biasing unit for biasing the main circuit unit and the assistant circuit unit, respectively, and load stages connected to output stages of the main circuit unit and the assistant circuit unit, wherein the output stages of the main circuit unit and the assistant circuit unit are coupled to each other.

2 Claims, 13 Drawing Sheets

ACTIVE CIRCUIT HAVING IMPROVED LINEARITY USING MULTIPLE GATED TRANSISTOR

CROSS-REFERENCE TO RELATED PATENT APPLICATIONS

This application is a division of application Ser. No. 11/178,481, filed Jul. 12, 2005, now pending, and related to a concurrently filed application entitled ACTIVE CIRCUIT HAVING IMPROVED LINEARITY USING MULTIPLE GATED TRANSISTOR, and based on Korean Patent Application No. 10-2004-0071149, filed Sep. 7, 2004, by Tae Wook Kim, Bonkee Kim and Kwyro Lee, the disclosures of which are incorporated herein by reference in their entirety. This application claims only subject matter disclosed in the parent application and therefore presents no new matter.

BACKGROUND OF THE INVENTION

1. Field of the Invention

The present invention relates to improved linearity of an active circuit, and more particularly, to an active circuit having improved linearity using a main circuit unit and an assistant circuit unit.

2. Background of the Related Art

Recently, the reference for the linearity of semiconductor devices is IP3 (3rd Intercept Point). IP3 means that two points meet under the assumption that the fundamental output and the IM3 (3rd Inter-modulation) component continue to increase without being saturated.

At this time, IP3 is classified into IIP3 (Input IP3) and OIP3 (Output IP3). IIP3 is used when IP3 is read from the viewpoint of the input side, and OIP3 is used when IP3 is read from the viewpoint of the output side.

Characteristics regarding the conventional active element will be schematically described with reference to the drawings, and problems thereof will be also described.

Figure 1:
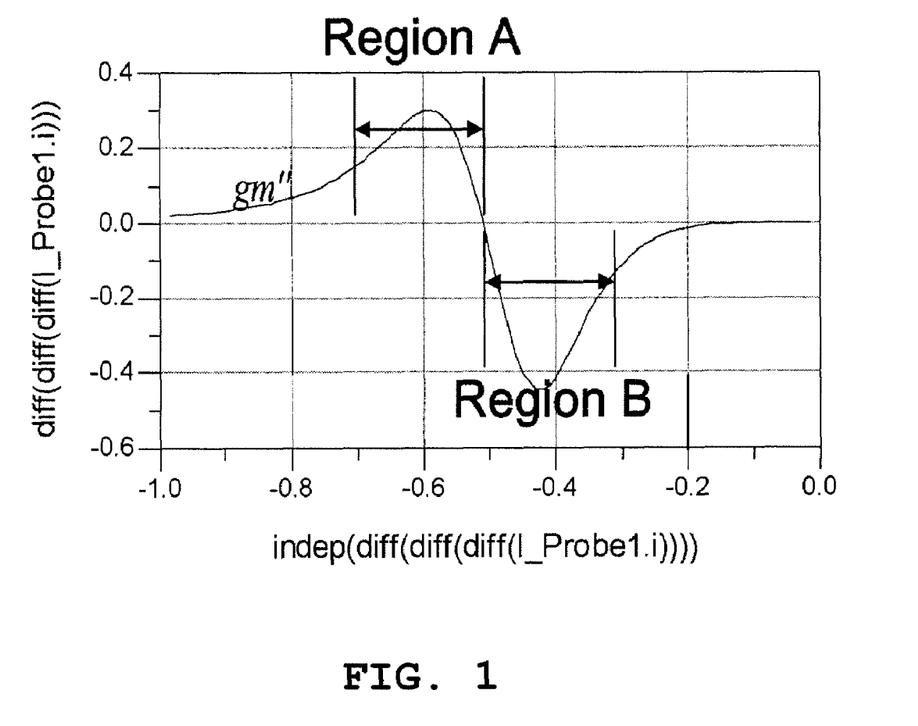
FIG. 1 is a graph showing the secondary differential coefficient of the transconductance of a conventional common gate circuit.

FIG. 1 is a graph showing the secondary differential coefficient of the transconductance of a conventional common gate circuit.

The conventional common gate circuit is usually used as a circuit for generating 50(ohm) being RF input impedance since input resistance can be designed to have 1/gm.

In FIG. 1, a region A and a region B divided and shown.

At this time, the coefficient related to the transistor linearity is gm" being the secondary differential coefficient of the transconductor. In the region A being a main use region, the value of gm" has a positive value. The linearity of the circuit becomes low due to the positive value.

Figure 2:
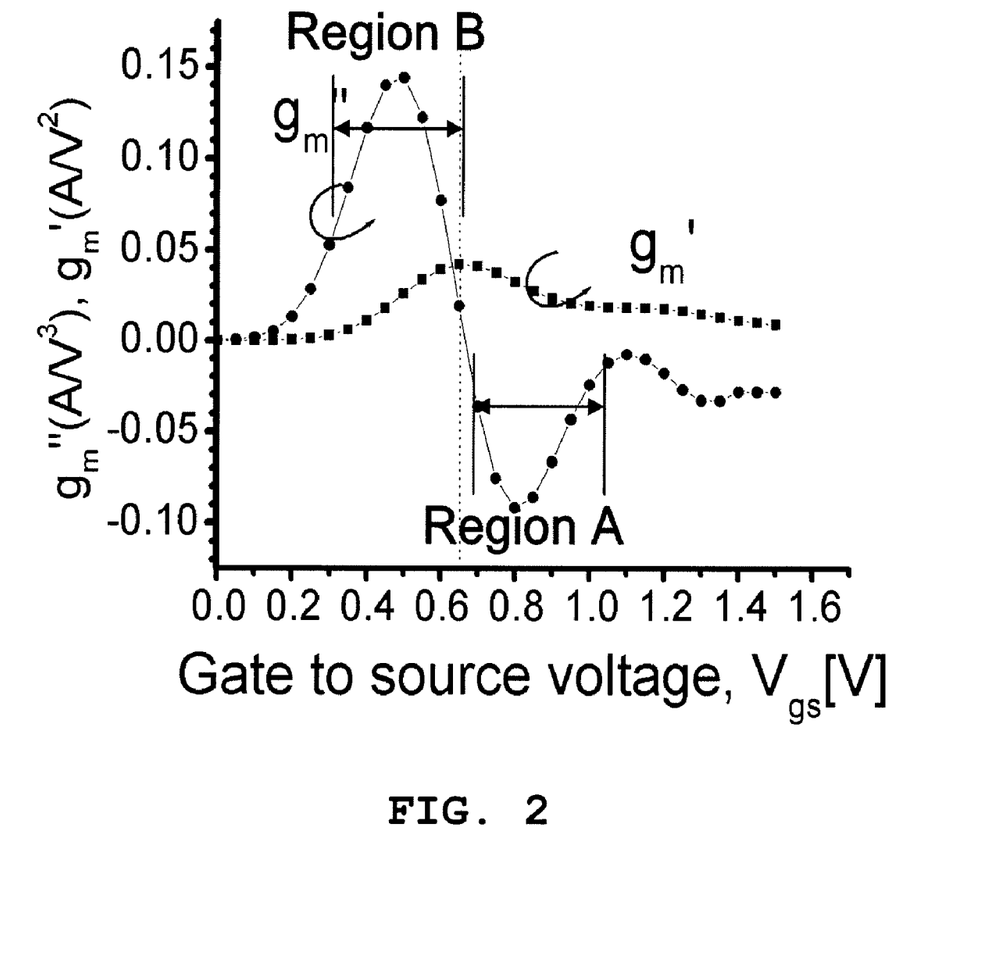
FIG. 2 is a graph showing the secondary differential coefficient of the transconductance of a conventional common drain circuit.

FIG. 2 is a graph showing the secondary differential coefficient of the transconductance of a conventional common drain circuit.

The conventional common drain circuit is usually used as a buffer circuit since it has high input impedance and low output resistance.

In FIG. 2, a region A and a region B are divided and shown.

At this time, the coefficient related to the transistor linearity is gm" being the secondary differential coefficient of the transconductor. In the region A being a main use region, the value of gm" has a negative value. The linearity of the circuit becomes low due to the negative value.

Further, the linearity of the conventional common drain circuit can be expressed into the following Equation (1).

[Equation 1]

$$IIP3_{SF} = IIP3_{NMOS} \cdot (1+T)^{3/2} \qquad (1)$$

Where $T = g_m \cdot (R_L // R_O)$

As can be seen from Equation 1, if the load impedance is higher, the linearity increases since feedback increases. In the case of a high frequency circuit, however, it is difficult to obtain the linearity since the load impedance is difficult to be higher.

SUMMARY OF THE INVENTION

Accordingly, the present invention has been made in view of the above problems occurring in the prior art, and it is an object of the present invention to provide an active circuit in which gm" being the secondary differential coefficient of the transconductance becomes minimal.

Another object of the present invention is to provide an active circuit in which the linearity of the amplifier circuit can be increased by minimizing gm".

To achieve the above objects, according to an aspect of the present invention, there is provided a common gate circuit having improved linearity, including a main circuit unit consisting of a common gate circuit having a drain terminal through which an input signal is output as an output signal, an assistant circuit unit having a common gate circuit in order to assist the linearity of the main circuit unit, a biasing unit for biasing the main circuit unit and the assistant circuit unit, respectively, and load stages connected to output stages of the main circuit unit and the assistant circuit unit, wherein the output stages of the main circuit unit and the assistant circuit unit are coupled to each other.

According to another aspect of the present invention, there is provided a common drain circuit having improved linearity, including a main circuit unit having a common drain circuit used as a buffer against an input signal, an assistant circuit unit having a common drain circuit for assisting the linearity of the main circuit unit, a biasing units for biasing the main circuit unit and the assistant circuit unit, respectively, and a power supply stage for applying a power supply voltage to the main circuit unit and the assistant circuit unit, respectively, wherein output stages of the main circuit unit and the assistant circuit unit are interconnected.

According to still another aspect of the present invention, there is provided 9. A single input differential output circuit having improved linearity, including a first circuit unit including a main circuit unit having a common gate circuit that outputs an output signal having the same phase as that of an input signal, and an assistant circuit unit having a common gate circuit in order to improve the linearity of the main circuit unit, a second circuit unit including a main circuit unit having a common source circuit that outputs an output signal having a phase difference of 180 degree from the first circuit unit, and an assistant circuit unit having a common source circuit in order to improve the linearity of the main circuit unit, a biasing unit for biasing the main and assistant circuit units of the first and second circuit units, respectively, and load stages respectively connected to the first circuit unit and the second circuit unit, wherein the main and assistant circuit units of the first and second circuit units are applied with the same input signal, and the first and second circuit units form a differential pair.

According to still another aspect of the present invention, there is provided a differential circuit having improved linearity, including a first circuit unit including a main circuit unit having a common gate circuit, and an assistant circuit unit having a common gate circuit in order to improve the linearity of the main circuit unit, a second circuit unit including a main circuit unit having a common gate circuit for a differential operation, and an assistant circuit unit having a common gate circuit in order to improve the linearity of the main circuit unit, a biasing unit for biasing the main and assistant circuit units of the first and second circuit units, respectively, and load stages respectively connected to the first circuit unit and the second circuit unit, wherein the main and assistant circuit units of the first and second circuit units are applied with input signals, respectively, and the first and second circuit units form a differential pair.

According to still another aspect of the present invention, there is provided a differential circuit having improved linearity, including a first circuit unit including a main circuit unit having a common gate circuit, and an assistant circuit unit having a common gate circuit in order to improve the linearity of the main circuit unit, a second circuit unit including a main circuit unit having a common drain circuit for performing a differential operation together with the first circuit unit, and an assistant circuit unit having a common drain circuit in order to improve the linearity of the main circuit unit, a biasing unit for biasing the main and assistant circuit units of the first and second circuit units, respectively, and power supply voltages respectively connected to the first circuit unit and the second circuit unit, wherein the main and assistant circuit units of the first and second circuit units are applied with input signals, respectively, and the first and second circuit units form a differential pair.

BRIEF DESCRIPTION OF THE DRAWINGS

Further objects and advantages of the invention can be more fully understood from the following detailed description taken in conjunction with the accompanying drawings in which.

DETAILED DESCRIPTION OF THE PREFERRED EMBODIMENTS

The present invention will now be described in detail in connection with preferred embodiments with reference to the accompanying drawings.

Figure 3A:
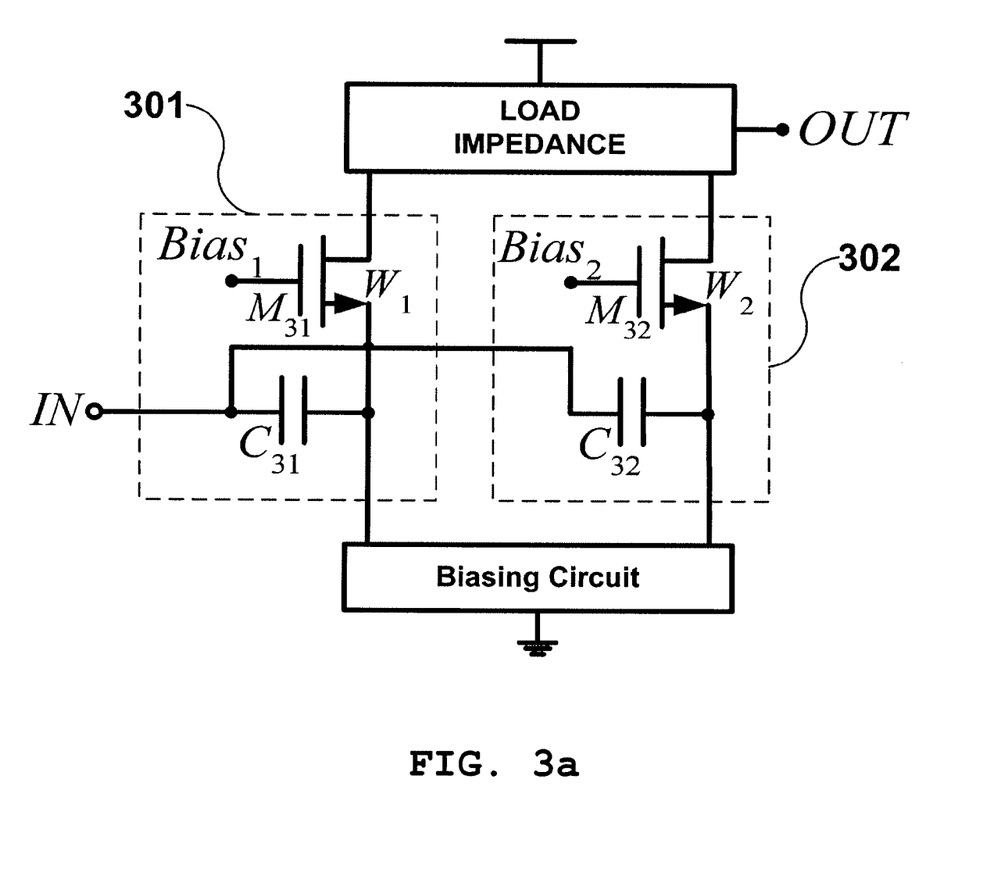
FIG. 3a shows a common gate circuit according to an embodiment of the present invention.

FIG. 3a shows a common gate circuit according to an embodiment of the present invention.

Referring to FIG. 3a, the common gate circuit includes a main circuit unit 301 and an assistant circuit unit 302.

The main circuit unit 301 consists of a common gate circuit having a first transistor M31 whose width function is W1 and a capacitor C31.

To the source of the first transistor M31 of the main circuit unit 301 is input an input signal, and to the gate of the first transistor M31 thereof is input a first bias.

Further, the assistant circuit unit 302 is comprised of a common gate circuit having a second transistor M32 whose width function is W2 and a capacitor C32.

To the source of the second transistor M32 of the assistant circuit unit 302 is input an input signal, and to the gate of the second transistor M32 thereof is input a second bias.

The drains of the first and second transistors M31, M32 are connected to load impedance.

The sources of the first and second transistors M31, M32 are coupled to each other in a parallel manner. The load impedance forms an output stage.

At this time, the first and second transistors M31, M32 preferably have different width functions W1 and W2. The first and second biases also preferably have a different value.

The main circuit unit 301 has low linearity because the value gm" has a positive value. Thus, in order to lower the value gm", gm" is offset using a negative region of another transistor.

At this time, in order to use the negative region of another transistor, an adequate offset bias value is used and the width function of a transistor is adjusted.

That is, in order to offset the value gm" of the transistor of the main circuit unit 301, the assistant circuit unit 302 having an adequate offset bias and an adequate width function is added.

In this case, the assistant transistor is biased to a weak inversion region. Thus, addition power consumption is insignificant.

In other words, gm" can be offset by differentiating the first and second biases I31, I32 and the width functions of the first and second transistors M31, M32 of the main and assistant circuit units 301, 302.

Furthermore, the assistant circuit unit 302 is constructed in plural, but can be also constructed to accomplish the technical spirit of the present invention.

Figure 3B:
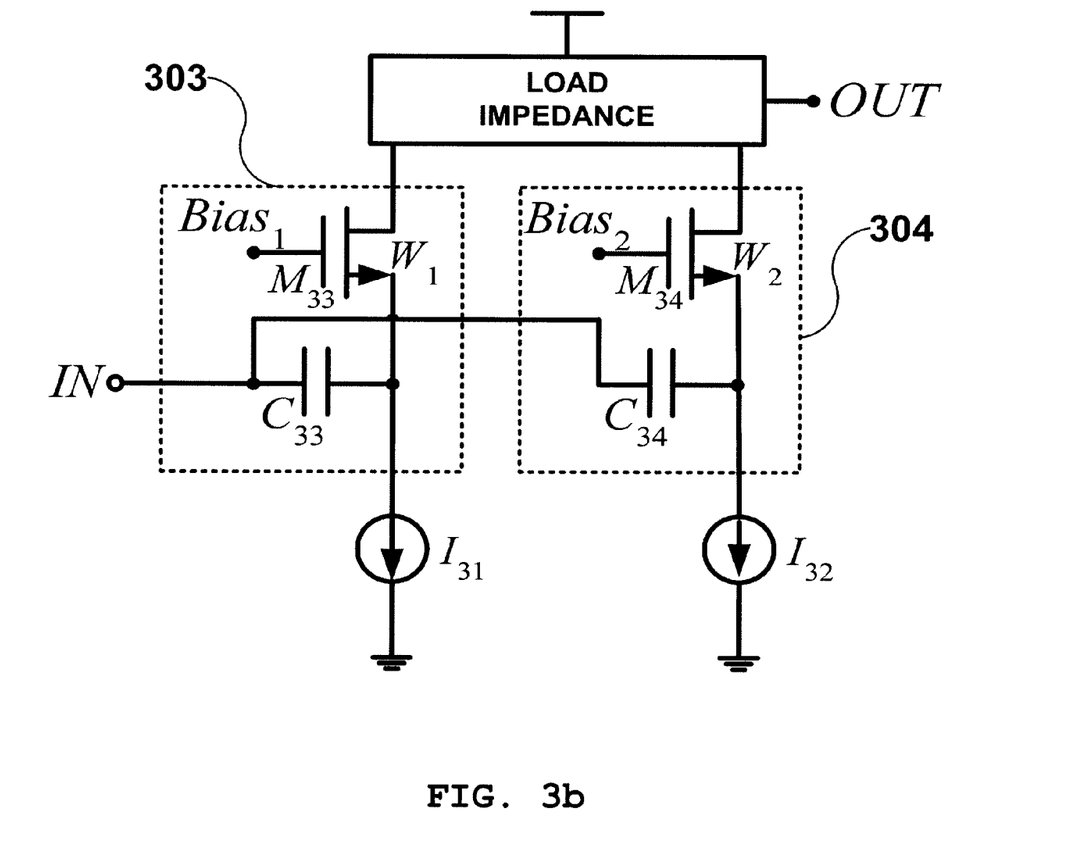
FIG. 3b shows a common gate circuit according to another embodiment of the present invention.

FIG. 3b shows a common gate circuit according to another embodiment of the present invention.

Referring to FIG. 3b, the common gate circuit according to an embodiment of the present invention includes a main circuit unit 303 and an assistant circuit unit 304.

The main circuit unit 303 is comprised of a common gate circuit having a first transistor M33 whose width function is W1, and a capacitor C33.

The source of the first transistor M33 of the main circuit unit 303 and one end of a current source I31 are connected, and to the gate of the first transistor M33 is applied a first bias.

Further, the assistant circuit unit 302 is comprised of a common gate circuit having a second transistor M34 whose width function is W2, and a capacitor C34.

The source of the second transistor M34 of the assistant circuit unit 302 and one end of a current source I32 are connected, and to the gate of the second transistor M34 is applied a second bias.

The sources of the first and second transistors M33, M34 are coupled to each other in a parallel manner, and the drains thereof form load impedance and an output stage.

To the sources of the first and second transistors M33, M34 are respectively applied a first static current source I31 and a second static current source I32.

The first and second transistors M33, M34 preferably have different width functions W1 and W2. The first and second static current sources I31, I32 preferably have a different value.

Figure 3C:
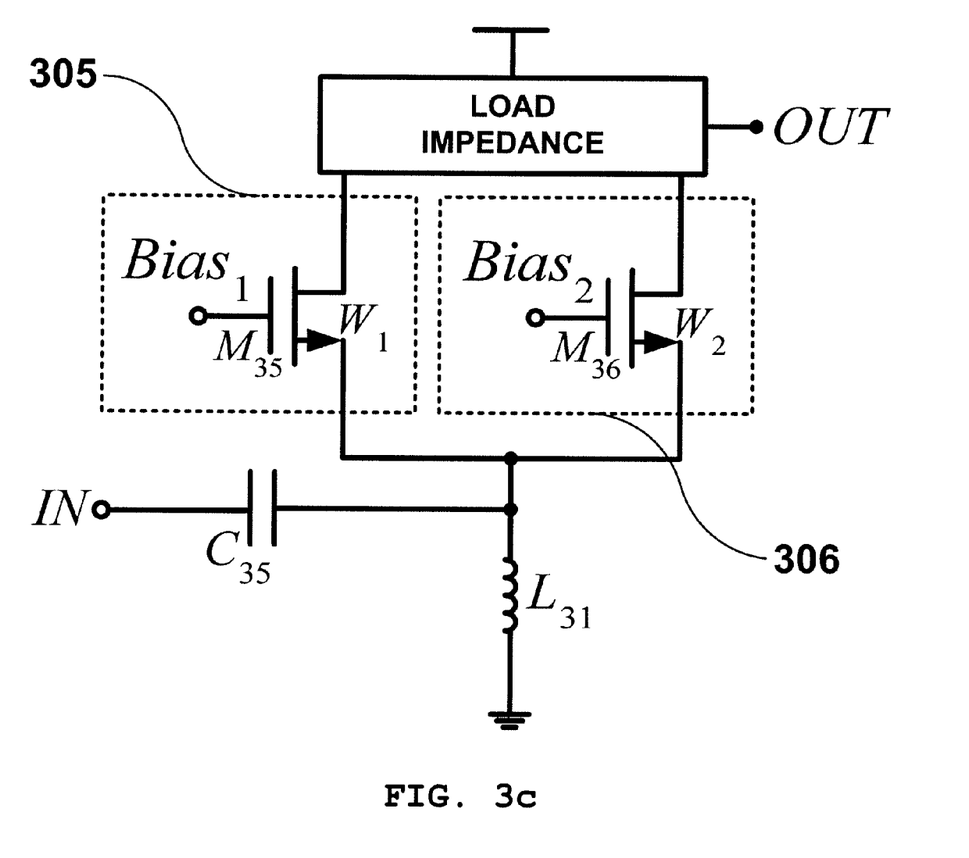
FIG. 3c shows a common gate circuit according to still another embodiment of the present invention.

FIG. 3c shows a common gate circuit according to still another embodiment of the present invention.

Referring to FIG. 3c, the common gate circuit according to another embodiment of the present invention includes a main circuit unit 305 and an assistant circuit unit 306.

The main circuit unit 305 constitutes the common gate circuit together with a first transistor M35 having the width function of W1.

The source of the first transistor M35 and the signal input unit are interconnected to form a main circuit 305.

To the gate of the first transistor M35 is applied a first bias Bias1.

Moreover, the assistant circuit unit 306 constitutes the common gate circuit together with the second transistor M36 having the width function of W2.

The source of the second transistor M36 and the signal input unit are interconnected to form an assistant circuit 306.

To the gate of the second transistor M36 is applied a second bias Bias2.

The drain of each of the first and second transistors M35, M36 constitute the load impedance and the output stage.

In this case, the first and second transistors M35, M36 preferably have different width functions W1 and W2, and the biases Bias1 and Bias2, respectively.

Figure 4:
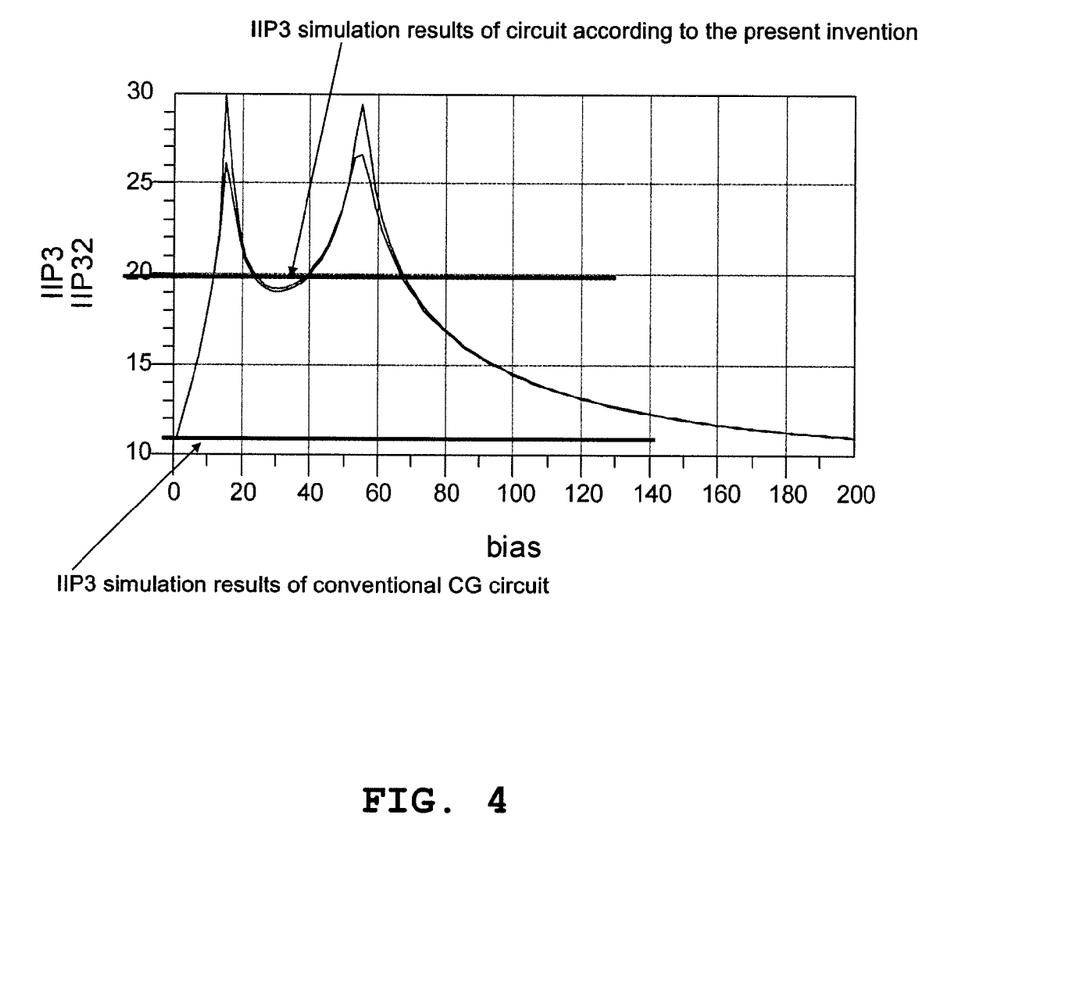
FIG. 4 shows the simulation results of IIP3 between the common gate circuit according to the present invention and the conventional common gate circuit.

FIG. 4 shows the simulation results of IIP3 between the common gate circuit according to the present invention and the conventional common gate circuit.

From the simulation results of IIP3 of FIG. 4, it can be seen that the common gate circuit having improved linearity according to the present invention has IIP3, which is improved about 10 dB compared to that of the conventional common gate circuit.

Figure 5A:
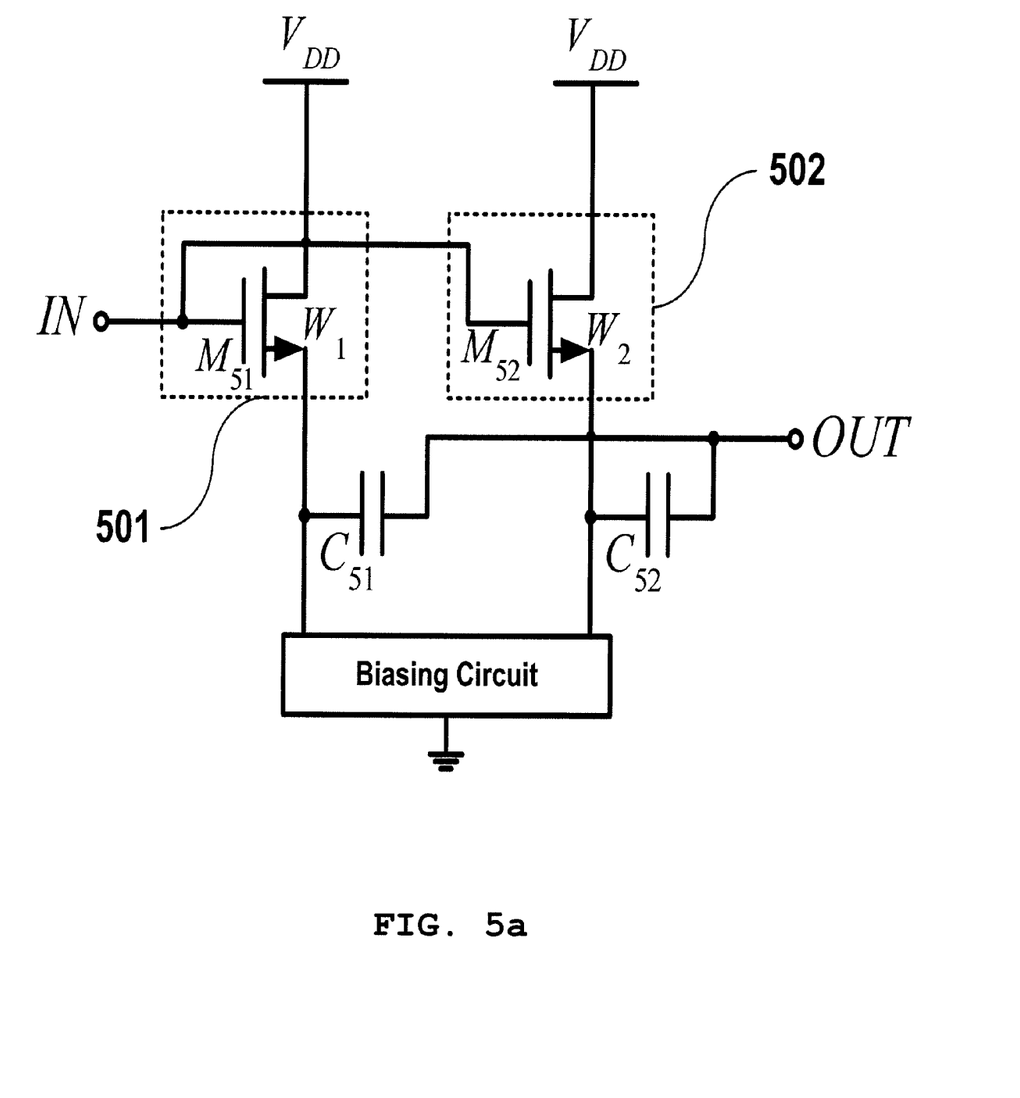
FIG. 5a shows a common drain circuit according to an embodiment of the present invention.

FIG. 5a shows a common drain circuit according to an embodiment of the present invention.

Referring to FIG. 5a, the common drain circuit according to the present invention includes a main circuit unit 501 and an assistant circuit unit 502.

The main circuit unit 501 includes a first transistor M51 having the width function of W1, and consists of a common drain circuit.

The source of the first transistor M51 of the common drain circuit of the main circuit unit 501 and a biasing circuit are interconnected to form a common drain main circuit unit 501. To the gate of the first transistor M51 is applied an input signal.

Furthermore, the assistant circuit unit 502 includes a second transistor M52 having the width function of W2, and consists of a common drain circuit.

The source of the second transistor M52 of the common drain circuit of the assistant circuit unit 502 and the biasing circuit are interconnected to form a common drain assistant circuit 502. To the gate of the second transistor M52 is applied an input signal.

The gates of the first and second transistors M51, M52 are coupled to each other in a parallel manner, and are applied with an input signal IN.

The sources of the first and second transistors M51, M52 are interconnected to form the output stage.

In this case, the transistors M51 and M52 preferably have different width functions W1 and W2.

In the use region of the main circuit unit 501, the linearity of the circuit is lowered since the value gm" has a negative value. Thus, in order to make low the value gm", the value gm" is offset using a positive region of another transistor.

At this time, in order to use the positive region of another transistor, a proper offset bias value is used and the width function of the transistor is adjusted.

That is, in order to offset the value gm" of the transistor of the main circuit unit 501, the assistant circuit unit 502 having an adequate offset bias and an adequate width function is added.

In other words, the value gm" can be offset by differentiating first and second static current sources I51, I52 and width functions of the first and second transistors M51, M52 of the main and assistant circuit units 501, 502.

Furthermore, the assistant circuit unit 502 is constructed in plural, but can be also constructed to accomplish the technical spirit of the present invention.

Figure 5B:
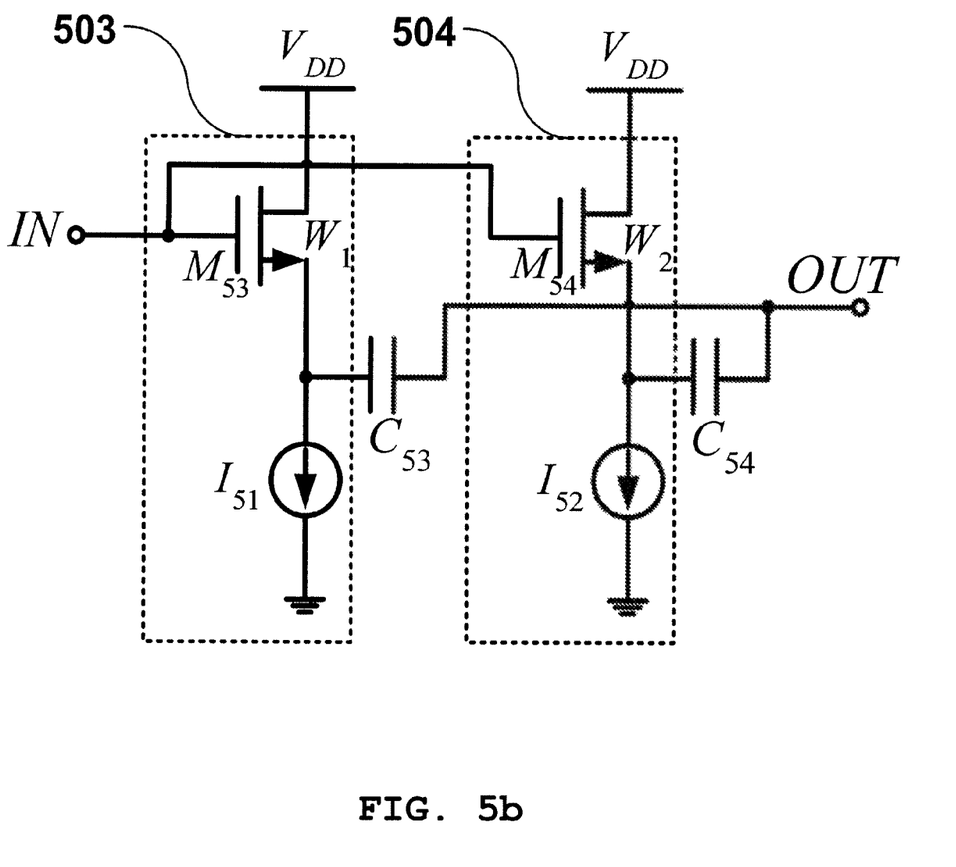
FIG. 5b shows a common drain circuit according to another embodiment of the present invention.

FIG. 5b shows a common drain circuit according to another embodiment of the present invention.

Referring to FIG. 5b, the common drain circuit according to an embodiment of the present invention includes a main circuit unit 503 and an assistant circuit unit 504.

The main circuit unit 503 includes a first transistor M53 having the width function of W1, and consists of a common drain circuit.

The source of the first transistor M53 of the common drain circuit and one end of the first static current source I51 are connected to form the main circuit unit 501 of the common drain. To the gate of the first transistor M51 is applied an input signal.

Further, the assistant circuit unit 504 includes a second transistor M54 having the width function of W2, and consists of a common drain circuit.

The source of the second transistor M54 of the common drain circuit of the assistant circuit unit 504 and one end of the second static current source I52 are interconnected to form a common drain assistant circuit 504. To the gate of the transistor M54 is applied an input signal.

The gates of the first and second transistors M53, M54 are connected in a parallel manner, and are applied with the input signal IN.

The sources of the first and second transistors M53, M54 are interconnected to form the output stage.

In this case, the transistors M53 and M54 preferably have different width functions W1 and W2.

Figure 5C:
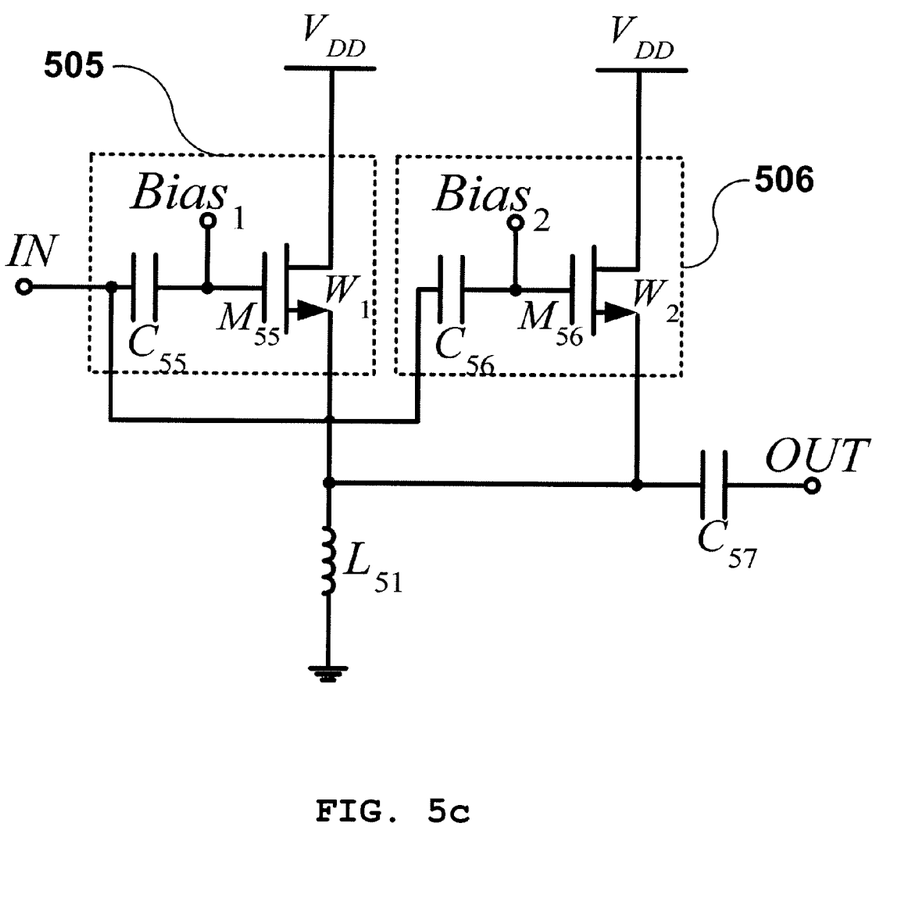
FIG. 5c shows a common drain circuit according to further another embodiment of the present invention.

FIG. 5c shows a common drain circuit according to further another embodiment of the present invention.

Referring to FIG. 5c, the common drain circuit according to another embodiment of the present invention includes a main circuit unit 505 and an assistant circuit unit 506.

The main circuit unit 505 constitutes the common drain circuit together with a first transistor M55 having the width function of W1.

To the gate of the first transistor M55 of the common drain circuit is applied a first bias, thus forming a common drain main circuit 505.

Moreover, the assistant circuit unit 506 constitutes the common drain circuit together with a second transistor M56 having the width function of W2.

To the gate of the second transistor M56 of the common drain circuit of the assistant circuit unit 506 is applied a second bias, thereby forming a common drain assistant circuit 506.

The sources of the first and second transistors M55, M56 are coupled each other in a parallel manner, thus forming an output stage.

At this time, the first and second transistors M55 and M56 have different width functions W1 and W2.

Figure 6:
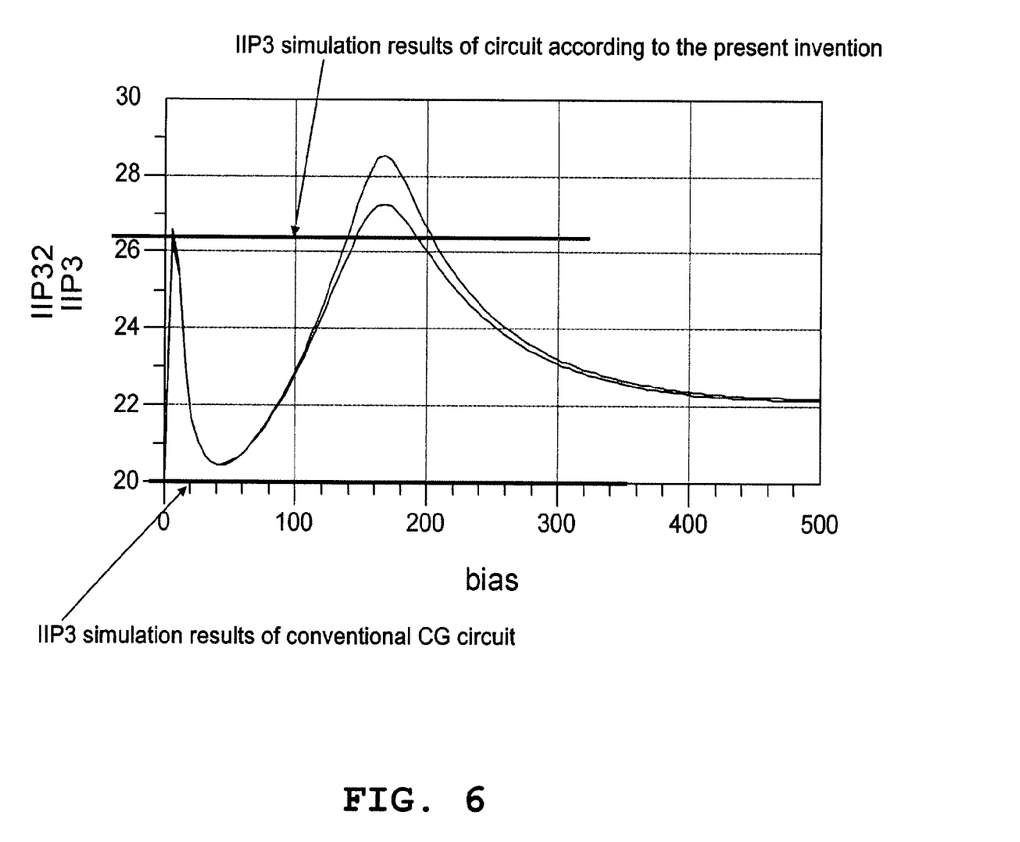
FIG. 6 shows the simulation results of IIP3 between the common drain circuit according to the present invention and the conventional common drain circuit.

FIG. 6 shows the simulation results of IIP3 between the common drain circuit according to the present invention and the conventional common drain circuit.

From the simulation results of IIP3 of FIG. 6, it can be seen that the common drain circuit having improved linearity according to the present invention has IIP3, which is improved about 10 dB compared to that of the conventional common drain circuit.

That is, in order to improve the linearity, the region B of FIG. 2 is reduced through the addition of the assistant circuit unit according to the present invention.

Figure 7:
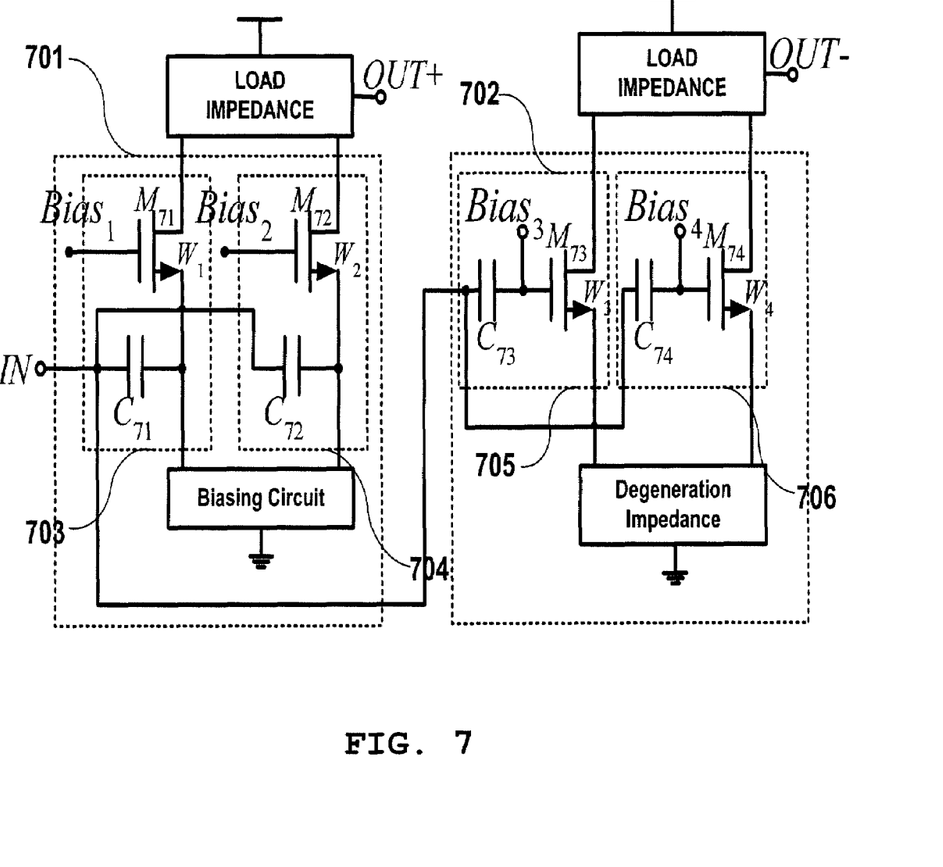
FIG. 7 shows a single input differential output circuit using the common gate circuit and the common source circuit according to the present invention.

FIG. 7 shows a single input differential output circuit using the common gate circuit and the common source circuit according to the present invention.

A circuit that changes a single ended input signal as a differential signal can be implemented in various methods.

Of them, a method using an active element employs a common gate circuit and a common source circuit.

At this time, the common gate circuit outputs a signal having the same phase as an input phase, and the common source circuit outputs a signal having an opposite phase as an input phase.

For the above reason, two input signals are converted into differential signals by means of the circuit so that the single-ended inputs have a phase difference of 180 degree.

In the embodiment of the present invention shown in FIG. 7, an assistant circuit unit for offsetting the value gm" is added to the common gate circuit and the common source circuit, respectively, in order to improve the linearity in the above-described circuit.

As shown in FIG. 7, the single input differential output circuit according to an embodiment of the present invention includes a first circuit unit 701 and a second circuit unit 702.

The first circuit unit 701 includes a main circuit unit 703 and an assistant circuit unit 704 each of which consists of a common gate circuit having a first transistor M71 whose width function is W1 and a second transistor M72 whose width function is W2, respectively.

The first and second transistors M71, M72 of the main circuit unit 703 and the assistant circuit unit 704 of the first circuit unit 701 are biased by first and second biases Bias1, Bias2 connected to their gate terminals, thus reducing the secondary differential coefficient of the transconductance. The linearity is thus improved.

The second circuit unit 702 includes a main circuit unit 705 and an assistant circuit unit 706 each of which consists of a common source circuit having a third transistor M73 whose width function is W3 and a fourth transistor M74 whose width function is W4, respectively.

The first and second transistors M71, M72 of the main circuit unit 703 and the assistant circuit unit 703 of the first circuit unit 701 have source terminals connected to a biasing circuit. The third and fourth transistors M73, M74 of the main circuit unit 705 and the assistant circuit unit 706 of the second circuit unit 702 are biased by first and second biases Bias1, Bias2 connected to their gate terminals, reducing the secondary differential coefficient of the transconductance. The linearity is thus improved.

At this time, the relation between the output current and the input voltage of the common gate circuit can be expressed into the following Equation 2, and the relation between the input voltage and the output current of the common source circuit can be expressed into the following Equation 3.

[Equation 2]

$$i_{DS} = I_{DC} - \frac{g_m}{1!}v_{gs} + \frac{g'_m}{2!}v_{gs}^2 - \frac{g''_m}{3!}v_{gs}^3 + \quad (2)$$

[Equation 3]

$$i_{DS} = I_{dc} + \frac{g_m}{1!}v_{gs} + \frac{g'_m}{2!}v_{gs}^2 + \frac{g''_m}{3!}v_{gs}^3 + \quad (3)$$

The relation Equation of the differential output can be found using a difference between the Equations 2 and 3.

[Equation 4]

$$i_{DSdiff} = \frac{g_m}{1!}v_{gs} + \frac{g''_m}{3!}v_{gs}^3 + \quad (4)$$

As can be seen from Equation 4, the harmonic of the even index disappears, and the linearity of the even index is thus improved. The harmonic of the odd index still disappears, and gm" has a great influence on IIP3.

In this case, the entire IIP3 can be improved by adding a circuit in which gm" is offset to the common gate circuit and the common source circuit, respectively.

The output of the first circuit unit 701 has the same phase as that of the input signal. The output of the second circuit unit 702 has a phase difference of 180 degree from the input signal.

The first circuit unit 701 connects the assistant circuit unit 704 having different characteristics to the main circuit unit 703 using the common gate circuit according to the present invention, thus increasing the linearity of the common gate circuit of the circuit. In the same manner as the second circuit unit 702, the assistant circuit unit 706 is used to improve the linearity of the common source circuit. Using the transistor as such is called MGTR (Multiple Gated Transistor).

At this time, description on MGTR is disclosed in the thesis "A New Linearization Technique for MOSFET RF Amplifier Using Multiple Gated Transistors," IEEE Microwave and Guided Wave Letters, vol. 10, no. 9, pp. 371-373, 2000". This thesis was posted by the inventor of this application.

As a result, the first circuit unit 701 consisting of the common gate circuit and the second circuit unit 702 consisting of the common source are interconnected, and a circuit having improved linearity is constructed in each circuit unit. Thus, the differential circuit can have improved linearity.

Moreover, in the differential circuit shown in FIG. 7, the assistant circuit unit of each of the first circuit unit and the second circuit unit can be constructed in plural in order to implement the technical spirit of the present invention.

Figure 8A:
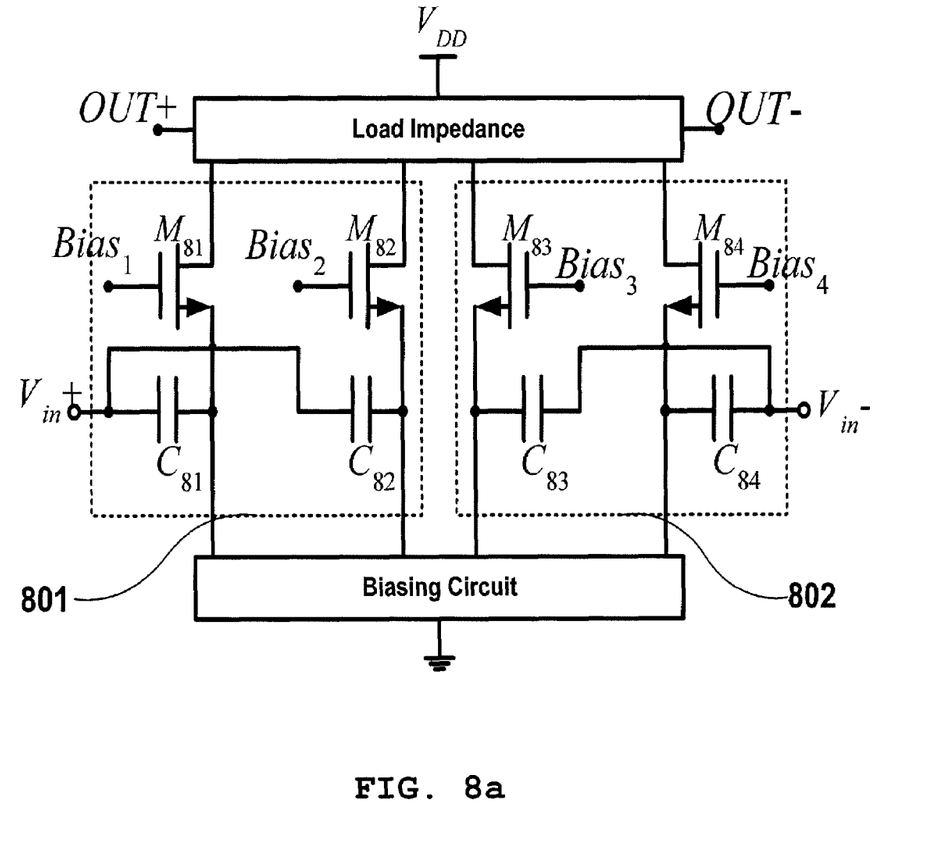
FIG. 8a shows a differential circuit using the common gate circuit according to the present invention.

FIG. 8a shows a differential circuit using the common gate circuit according to the present invention.

Referring to FIG. 8a, the differential circuit using the common gate circuit according to the present invention includes a first circuit unit 801 and a second circuit unit 802.

The first circuit unit 801 includes a main circuit unit and an assistant circuit unit consisting of a common gate circuit having a first transistor M81 and a second transistor M82.

The second circuit unit 802 is comprised of a main circuit unit and an assistant circuit unit consisting of a common gate circuit having a third transistor M83 and a fourth transistor M84.

The construction and description of the first circuit unit 801 and the second circuit unit 802 are the same as those of the common gate having the main circuit unit and the assistant circuit unit. Thus, description thereof will be omitted for simplicity.

The drains of the first circuit unit 801 and the second circuit unit 802 are connected to load stages, respectively, to form different output stages. The sources of the first circuit unit 801 and the second circuit unit 802 are connected to a bias unit together with an input stage.

The first circuit unit 801 and the second circuit unit 802 constitute a differential circuit that outputs different outputs using different inputs.

Figure 8B:
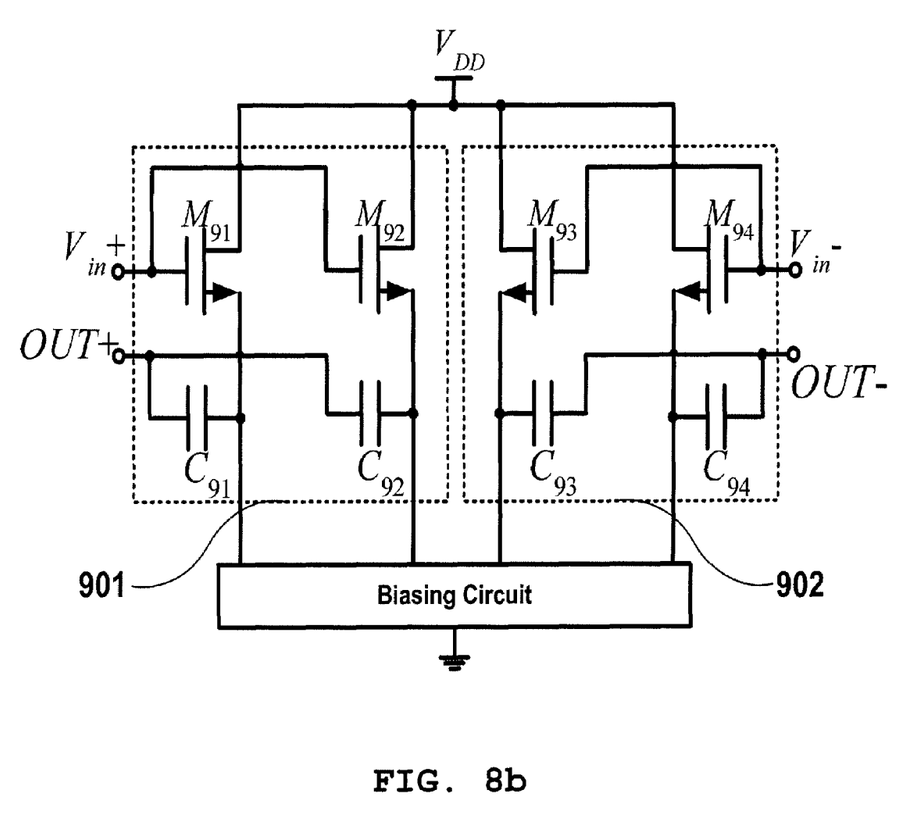
FIG. 8b shows a differential circuit using the common drain circuit according to the present invention.

FIG. 8*b* shows a differential circuit using the common drain circuit according to the present invention.

Referring to FIG. 8*b*, the differential circuit using the common drain circuit according to the present invention includes a first circuit unit 901 and a second circuit unit 902. The first circuit unit 901 is constructed using a main circuit unit and an assistant circuit unit consisting of a common drain circuit having a first transistor M91 and a second transistor M92. The second circuit unit 902 is constructed using a main circuit unit and an assistant circuit unit consisting of a common drain circuit having a third transistor M93 and a fourth transistor M94.

The construction and description of the first circuit unit and the second circuit unit are the same as those of the above embodiments. Thus, description thereof will be omitted for simplicity.

The drains of the first circuit unit 901 and the second circuit unit 902 are connected to the power supply voltage. The gates of the first circuit unit 901 and the second circuit unit 902 are applied with different input voltages. The sources of the first circuit unit 901 and the second circuit unit 902 are connected to a bias unit along with different output stages.

The first circuit unit 901 and the second circuit unit 902 constitute a differential circuit that outputs different outputs using different inputs.

As described above, according to the present invention, it is possible to provide an active circuit in which gm" being the secondary differential coefficient of the transconductance can be minimized.

It is also possible to provide an active circuit in which the linearity of an amplifier circuit can be increased by minimizing gm".

Furthermore, since a differential circuit for two circuit units consisting of a main circuit unit and an assistant circuit unit is constructed, the linearity can be improved.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A differential circuit having improved linearity, comprising:
    a first circuit unit including a main circuit unit having a common gate circuit, and an assistant circuit unit having a common gate circuit in order to improve the linearity of the main circuit unit;
    a second circuit unit including a main circuit unit having a common gate circuit for a differential operation, and an assistant circuit unit having a common gate circuit in order to improve the linearity of the main circuit unit;
    a biasing unit for biasing the main and assistant circuit units of the first and second circuit units, respectively; and
    load stages respectively connected to the first circuit unit and the second circuit unit,
    wherein the main and assistant circuit units of the first and second circuit units are applied with differential input signals, respectively, and the first and second circuit units form a differential pair.

2. The differential circuit as claimed in claim 1, wherein the biasing unit includes first and second static current sources that bias the main circuit unit and the assistant circuit unit of the first circuit unit, respectively, and third and fourth static current sources that bias the main circuit unit and the assistant circuit unit of the second circuit unit, respectively.

* * * * *